United States Patent [19]

Niino et al.

[11] Patent Number: 5,433,790

[45] Date of Patent: Jul. 18, 1995

[54] DEPOSIT FILM FORMING APPARATUS WITH MICROWAVE CVD METHOD

[75] Inventors: Hiroaki Niino; Tetsuya Takei, both of Nagahama; Ryuji Okamura, Shiga, all of Japan

[73] Assignee: Canon Kabushiki Kaisha, Tokyo, Japan

[21] Appl. No.: 344,610

[22] Filed: Nov. 18, 1994

Related U.S. Application Data

[63] Continuation of Ser. No. 794,011, Nov. 19, 1991, abandoned.

[30] Foreign Application Priority Data

Nov. 19, 1990 [JP] Japan ................. 2-311451

[51] Int. Cl.6 ............................................. C23C 16/30
[52] U.S. Cl. ................... 118/723 MW; 118/723 ME; 118/723 MP; 118/723 R
[58] Field of Search ............... 118/723 MW, 723 ME, 118/723 MR, 723 MA, 723 MP; 156/345

[56] References Cited

U.S. PATENT DOCUMENTS

| | | | |
|---|---|---|---|
| 4,897,284 | 1/1990 | Arai et al. | 427/39 |
| 4,930,442 | 6/1990 | Iida et al. | 118/723 |
| 4,952,273 | 8/1990 | Popov | 118/720 X |
| 4,960,073 | 10/1990 | Suzuki et al. | 118/723 |
| 4,998,979 | 3/1991 | Niino | 134/1 |
| 5,016,565 | 5/1991 | Saitoh et al. | 118/723 |
| 5,129,359 | 7/1992 | Takei et al. | 118/723 |

FOREIGN PATENT DOCUMENTS

60-186849  9/1985  Japan.
61-283116 12/1986  Japan.
62-67179  3/1987  Japan.

*Primary Examiner*—R. Bruce Breneman
*Assistant Examiner*—Jonathan D. Baskin
*Attorney, Agent, or Firm*—Fitzpatrick, Cella, Harper & Scinto

[57] ABSTRACT

A deposit film forming apparatus is disclosed. Cylindrical substrates are disposed within a reaction vessel to be substantially sealed so as to surround a discharge space, and microwave introducing means is provided to form a microwave discharge plasma containing a reactant arising from a source gas and contributing to the formation of film, apply the voltage to an electrode provided on said discharge space, and form a deposit film on a surface of said substrate, characterized in that said microwave introducing means except for at least a microwave introducing dielectric window is constituted of two areas made of mutually different materials, a first area for transmitting the microwave is composed of a metal, and a second area in contact with the plasma is composed of a dielectric of which the product of a dielectric constant ($\epsilon$) and a dielectric loss tangent (tan $\delta$) at a frequency of used microwave is equal to or less than $2 \times 10^{-2}$.

10 Claims, 5 Drawing Sheets

FIG.3B

DEPOSIT FILM FORMING APPARATUS WITH MICROWAVE CVD METHOD

This application is a continuation of application Ser. No. 07/794,011 filed Nov. 19, 1991, now abandoned.

BACKGROUND OF THE INVENTION

1. Field of the Invention

The present invention relates to an improved film forming apparatus for continuously forming a functional film, particularly, a crystalline or non-monocrystalline semiconductor which is appropriately usable as an electrophotographic photosensitive member, a photovoltaic device, an image input line sensor, an image pickup device, and a semiconductor device such as TFT, on a substrate with the microwave plasma CVD method.

2. Related Background Art

Heretofore, non-monocrystal deposit films such as amorphous silicon, for example, amorphous silicon compensated with hydrogen and/or halogen (e.g., fluorine or chlorine) [hereinafter abbreviated as A-Si(H,X)], or crystalline deposit films such as diamond thin film, have been proposed as a device member for use in a semiconductor device, an electrophotographic photosensitive member, an image input line sensor, an image pickup device, a photovoltaic device, and other various electronic devices or optical devices, and some of them are practically used. And it is known that those deposit films are formed with the plasma CVD method, that is, the method of decomposing a source gas with the glow discharge caused by the direct current or radio frequency, or the microwave to form a deposit film on a substrate such as glass, quartz, heat-resistive synthetic resin film, stainless, or aluminum, in which various apparatuses for use with that method have been proposed.

In particular, recently, the plasma CVD method using the microwave glow discharge decomposition or the microwave plasma CVD method (hereinafter abbreviated as µW-PCVD method) has also been noted in industries.

The µW-PCVD method has an advantage of offering a higher deposition speed and a higher source gas utilization efficiency than other methods. One example of µW-PCVD apparatus using such advantage is disclosed in Japanese Patent Application No. 60-186849. The apparatus as described in that patent increases the gas utilization efficiency by disposing a substrate so as to surround introducing means of the microwave energy to an inner chamber (or discharge space).

Also, in Japanese Patent Application No. 61-283116, an improved microwave technique for fabricating a semiconductor member has been disclosed. That is, the above patent discloses a technique of improving the characteristics of deposit film in such a manner as to provide an electrode for the control of plasma potential in a plasma space, and deposit the film while controlling ion bombardment onto the deposit film by applying a desired voltage to the electrode.

With these conventional methods, it was enabled to fabricate a relatively thick photoconductive material at certain high deposit speed and in utilization of the efficiency of source gas.

Figure 3A:
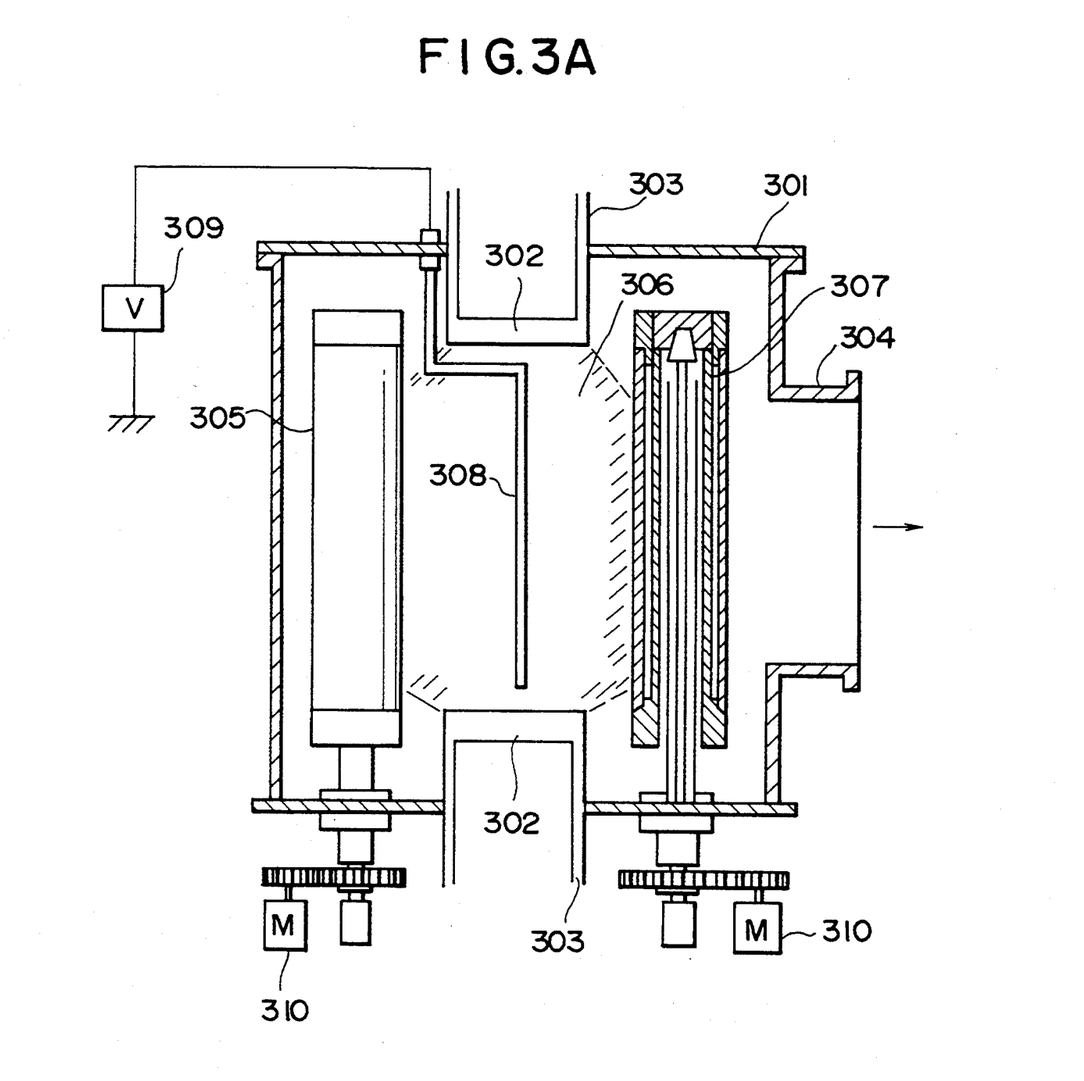
FIGS. 3A and 3B are typical explanatory views of longitudinal cross-section and transversal cross-section showing a conventional deposit film forming apparatus with the microwave plasma CVD method.
Figure 3B:
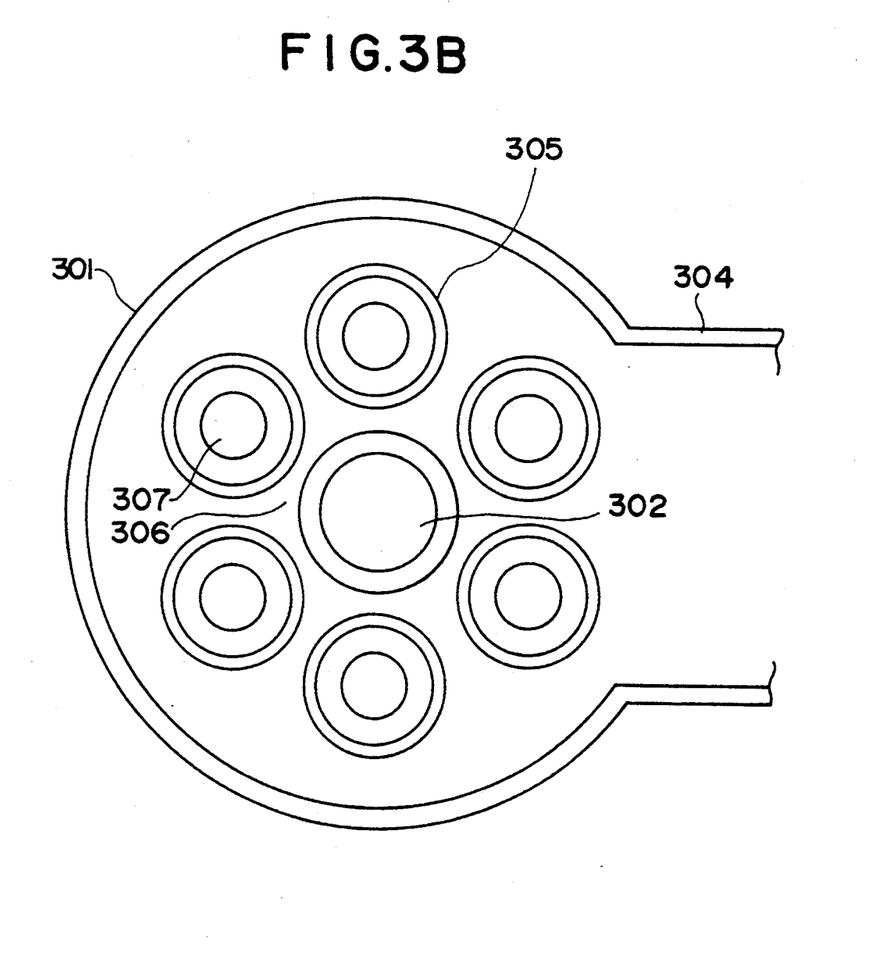

The deposit film forming apparatus with such an improved µW-PCVD method has typically an apparatus constitution as shown in a typical longitudinal cross-sectional view of FIG. 3A and a typical transversal cross-sectional view of FIG. 3B (FIG. 3B is a typical transversal cross-sectional view of the apparatus as shown in FIG. 3A 9).

In FIGS. 3A and 3B, 301 is a reaction vessel having a vacuum airtight structure. 302 is a microwave introducing dielectric window formed of a material capable of efficiently transmitting the microwave electric power into the reaction vessel and preserving the vacuum airtight (e.g., quartz glass or alumina ceramics). 303 is a transmission section of the microwave electric power, consisting of a waveguide and connected via a stub tuner (not shown) and an isolator (not shown) to a microwave power source (not shown). The dielectric window 302 is sealed airtightly to a wall of the waveguide 303. 304 is an exhaust pipe having one end opening to the reaction vessel 301 and the other end communicating to an exhaust apparatus (not shown). 306 is a discharge space surrounded and formed by a plurality of cylindrical substrates 305. 308 is an electrode for supplying an external electric bias to control the plasma potential, to which the D.C. or A.C. voltage is applied from a power source 309. Note that each cylindrical substrate is installed on a cylindrical holder containing a heater 307, each holder being rotated properly by drive means (rotary motor) 310.

The formation of deposit film with such a conventional deposit film forming apparatus can be performed in the following manner.

First, the reaction vessel 301 is exhausted via the exhaust pipe 304 by means of a vacuum pump (not shown) to adjust the pressure or internal pressure within the reaction vessel to less than about $1 \times 10^{-7}$ Torr. Then, the substrate 305 is heated and retained at a temperature suitable for the film deposition, with the heater 307. Thus, a source gas, for example, silane gas or hydrogen gas if an amorphous silicon deposit film is formed, is introduced via a gas inlet tube (not shown) into the reaction vessel 301. Then the microwave having a frequency of 500 MHz or more, preferably 2.45 GHz, is produced with the microwave power source (not shown) and introduced via the microwave waveguide 303 and the dielectric window 302 into the reaction vessel 301. At the same time or in parallel, the D.C. voltage from the power source 309, for example, is applied to the electrode 308 provided in the discharge space 306 as the external electric bias. Thus, the source gas is excited and dissociated by the microwave energy in the discharge space 306 surrounded and formed by a plurality of cylindrical substrates 305, so that the deposit film can be formed on all the surfaces of cylindrical substrates 305. At this time, by rotating each of the cylindrical substrates 305 around a central axis in the generatrix direction, the deposit film is formed on an entire surface of individual cylindrical substrate.

With such a conventional deposit film forming apparatus based on the µW-PCVD method, it is possible to obtain a deposit film having practical characteristics and uniformity at a certain film deposition speed. However, with such conventional deposit film forming apparatus based on the µW-PCVD method, there is a problem that significant skill may be required to obtain the deposit film in uniform quality and meeting the requirements of optical and electrical characteristics steadily, stably and at high yield, particularly in the field of high film deposition speed, as for example, in the fabrication of the deposit film having a large area and a relatively large film thickness such as an electrophotographic photosensitive member.

That is, in order to form a desired deposit film on a substrate of large area at high film deposition speed, with the utilization efficiency of source gas being maintained at high value, as is the case with the electrophotographic photosensitive member, the following conditions must be satisfied.

(1) It is necessary to deposit the film on a substrate of large area (in particular 3000 mm² or more) at high speed, and maintain excellent characteristics whereby a larger amount of source gas flow, a larger microwave energy and a lower pressure as compared with the conventional example are requisite.

(2) It is necessary to avoid the occurrence of defects over a large area (in particular 3000 mm² or more) and the peeling of the portion on which the deposit film is formed.

(3) It is necessary to make uniform the electrophotographic characteristics uniform over a large area (in particular 3000 mm² or more) up to the level at which there is no visible density difference on the image. To this end, the high uniformity of film thickness and quality that is required in the entire image forming is on the substrate.

Generally, when the deposit film is formed using the plasma by introducing the microwave into the reaction vessel, the deposit film is divided into an area (power limit area) where the film formation seed is increased with increasing microwave power because the source gas has not been completely decomposed and an area (flow limit area) where the film formation speed is not changed with increasing microwave power because the source gas has been completely decomposed, if the microwave electric power is increased with the source gas fixed at a constant flow rate. In the power limit area, as the utilization of the efficiency of source gas is small while the source gas left undecomposed may have a bad influence in the reaction within a gas phase or on the surface of the substrate, the characteristics of the obtained deposit film are lowered. Also, in the flow limit area, the excess energy from the decomposition of source gas becomes the internal energy of decomposed species, in which with a larger microwave power for raising the surface mobility on the surface of substrate, superior characteristics of deposit film can be obtained. As the method of introducing the microwave, it is common to use a waveguide with a dielectric window superior in the transmission of the microwave. However, when such a large energy is introduced via the waveguide using the dielectric window, the energy density of microwave within the reaction vessel is rendered very large. Therefore, the dispersion of formed deposit film in the film thickness and film quality is liable to occur between the substrate portion located near the window and the other substrate portion. Furthermore, more defects of deposit film may arise because the peeling of relatively thick film may occur in the vicinity of the microwave introducing window, or the peeled film may stick to another area.

In order to suppress the reaction of deposit species in the gas phase, and maintain the uniformity of deposit film in the film quality and thickness in good condition, it is important to perform a uniform discharge at a pressure lower than 50 mTorr. However, in such a pressure range, the discharge may be less liable to occur if the pressure is lower, whereby it is difficult to maintain a stable discharge.

Particularly, in order to further improve the characteristics of deposit film, with a method of controlling the ion bombardment onto deposit species by providing an electrode to be commonly used with the microwave plasma discharge in the discharge space and applying a desired voltage to the electrode, there is a problem that abnormal discharge called a spark may be induced. This spark is more easily induced if the microwave power is larger. As the microwave introducing means is provided at an end portion of cylindrical substrate as previously described, the ion density near the microwave introducing means is increased, so that the non-uniformity of ion bombardment onto the surface of substrate may arise between the neighborhood of microwave introducing means and other areas, and the discharge becomes unstable owing to low pressure for maintaining the characteristics of deposit film, thereby causing the non-uniformity in the characteristics of deposit film.

SUMMARY OF THE INVENTION

It is an object of the present invention to provide an improved deposit film forming apparatus which overcomes the above-mentioned problems in conventional deposit film forming apparatuses, and can form a functional deposit film having excellent characteristics useful for a device member such as a semiconductor device, an electrophotographic photosensitive member, an image input line sensor, a photovoltaic device, an image pickup device, TFT, and other various electronic devices or optical devices, with the $\mu$W-PCVD method, steadily, at good yield and at high film deposition speed.

It is a further object of the present invention to provide an improved deposit film forming apparatus with the $\mu$W-PCVD method which can form a non-monocrystalline deposit film such as an amorphous silicon deposit film or a monocrystalline deposit film such as a diamond deposit film, the film having excellent characteristics.

DETAILED DESCRIPTION OF THE PREFERRED EMBODIMENTS

A preferred film forming apparatus with the microwave plasma CVD method according to the present invention will be described below.

The film forming apparatus with the microwave plasma CVD method according to the present invention is a film forming apparatus in which cylindrical substrates are disposed within a reaction vessel substantially sealed so as to surround a discharge space, and microwave introducing means is provided to form a microwave discharge plasma containing a reactant arising from a source gas and contributing to the formation of film, applying the voltage to an electrode provided in the discharge space, and forming a deposit film on a surface of the substrate, characterized in that the microwave introducing means except for at least a microwave introducing dielectric window is constituted of two regions made of mutually different materials, a first area for transmitting the microwave is composed of a metal, and a second area in contact with the plasma is composed of a dielectric of which the product of a dielectric constant ($\epsilon$) and a dielectric loss tangent (tan $\delta$) at a frequency of used microwave is equal to or less than $2 \times 10^{-2}$.

With the film forming apparatus of the present invention, it is possible to stably maintain the discharge state in forming the functional deposit film for a long time, and suppress the occurrence of defects, thereby improving the characteristics of deposit film, so that the quality of formed functional deposit film can be maintained at a high level.

The present inventors have discovered, as described below, as a result of making many earnest studies to overcome the previously-mentioned problems in the conventional deposit film forming method and accomplish the previously-mentioned objects of the present invention.

The present invention has been completed based on those findings, and provides a film forming apparatus in which cylindrical substrates are disposed within a reaction vessel substantially sealed so as to surround a discharge space, and microwave introducing means is provided to form a discharge plasma containing a reactant arising from a source gas and contributing to the formation of film, applying the voltage to an electrode provided in the discharge space, and forming a deposit film on a surface of the substrate, characterized in that the vicinity of the microwave introducing means except for at least a microwave introducing dielectric window is constituted of two regions made of mutually different materials, a first area for transporting the microwave is composed of a metal, and a second area in contact with the plasma is composed of a dielectric of which the product of a dielectric constant ($\epsilon$) and a dielectric loss tangent (tan $\delta$) at a frequency of the microwave is equal to or less than $2 \times 10^{-2}$. In the following, the discoveries obtained from the experiments by the present inventors and the contents of the present invention will be described in detail.

With the film forming apparatus for forming a plasma with the microwave and forming a deposit film on a substrate of large area at high speed, the following conditions are required in addition to the conditions necessary for an ordinary plasma CVD apparatus.

① A uniform discharge must be stably maintained under low pressure to obtain a deposit film having uniform and excellent characteristics.

② A bias electrode must be provided in the discharge space so that if the electric field for the control of plasma potential is applied, the effect of the electric field may be more effectively exerted on the substrate and the abnormal discharge such as a spark may not be induced.

③ When a thick deposit film such as an electrophotographic photosensitive member is formed on the substrate, the deposit film of the portion other than the simultaneously formed substrate portion must be protected from being peeled off and scattered over the substrate, thereby causing some defects of the deposit film on the substrate.

Based on the discoveries of the present inventors, it has been clear that the material of microwave introducing means in contact with the plasma is very important to satisfy these conditions.

One method of improving the characteristics of deposit film obtained with the conventional film forming method is to increase the power of microwave as previously described. However, if too large a microwave power is introduced into the discharge space to make the discharge, the temperature of the substrate is locally elevated, causing the non-uniform characteristics. Particularly, when the microwave discharge continues beyond one hour, the temperature elevation of the substrate becomes significantly large, because the temperature on the portion other than the substrate such as substrate holder and reaction vessel is greatly increased, with the heating of the microwave plasma, so that the heat can not move from the substrate to other portions. Accordingly, means for cooling the substrate must be provided, thereby making the apparatus more complex.

As a reason why the deposit film obtained with the conventional deposit film forming apparatus may yield defects, the peeling of deposit film from the neighborhood of the microwave introducing means can be cited. In the vicinity of the microwave introducing means within the discharge space, the energy density is higher than at other positions, and the density of active species produced by the plasma is also higher. Thus, in the substrate, auxiliary substrate and the waveguide surface in the neighborhood of the microwave introducing means within the discharge space, thicker, or less adhesive in some cases, deposit film is formed than at other positions. Furthermore, as the energy density of microwave is high, the temperature of deposit film may be locally elevated, so that the deposit film is more likely to be peeled off than in other portions. This effect is particularly remarkable when She deposit film is formed by rotating the cylindrical substrate. That is, in order to obtain the deposit film of sufficient film thickness on the rotating cylindrical substrate, the deposit film having several times the thickness is formed or the exposing time to the discharge is longer on the portion exposed to the discharge without rotation such as waveguide, so that the peeling of deposit film is an important problem.

In particular, when the plasma potential is controlled by providing an electrode in the discharge space and applying the voltage to the electrode so as to substantially improve the characteristics of deposit film, the spark is more likely to occur with a larger microwave power, so that the discharge becomes unstable and the peeling of deposit film is caused, having a large effect on the characteristics of deposit film or the occurrence of defects.

Thus, considering the behavior of the plasma in the discharge space, the present inventors have examined whether the occurrence of a spark can be prevented in such a manner as to change the state of plasma and stabilize the discharge, particularly by using composite material for the microwave introducing means. As a result, from the fabrication of the deposit film in which the microwave introducing means except for the microwave introducing dielectric window is constituted of two regions made of mutually different materials, a first area for transmitting the microwave is composed of a metal, and a second area in contact with the plasma is composed of a dielectric of which the product of a dielectric constant ($\epsilon$) and a dielectric loss tangent (tan δ) at a frequency of used microwave is equal to or less than $2 \times 10^{-2}$, it has been found that the characteristics of deposit film are improved and the occurrence of defects is suppressed, so that the productivity can be greatly improved to accomplish the objectives.

Conventionally, the surface of the portion other than the substrate in contact with the plasma may be any kind if it can retain the vacuum and not be violated by the plasma, but generally a metal such as stainless steel or aluminum has been used as it is necessary to surround the plasma with a material reflecting the microwave substantially completely to prevent the leakage of the microwave to the outside and make more effective use of the microwave. However, according to the views of the present inventors, it has been clear that the material on the surface of the portion other than the substrate in contact with the plasma within the reaction vessel is an important factor in forming the deposit film having excellent characteristics with less defects on the substrate.

That is, when forming the deposit film with the plasma CVD method, the desorption of hydrogen atoms from the surface of deposit film or the relocation for stable connection between constituent atoms takes place on the surface of the substrate. These reactions are indispensable to obtain the deposit film having excellent characteristics, and generally facilitated by the thermal energy. However, if the deposit film is formed on the substrate at high speed, with the microwave plasma CVD method, the thermal energy of the substrate is insufficient to cause a full surface reaction. One method of compensating for that energy is to increase the power of microwave. Also, it is necessary to facilitate the surface reaction by providing an electrode in the discharge space to apply the electric field, and making the ion bombardment onto the substrate to cause a local anneal. A larger energy of bombardment is required when the deposit film is formed at higher speed, and thus a larger voltage is required to be applied onto the electrode.

Also, it is necessary to control the ion bombardment onto the substrate, so that the surface of the substrate is required to have an excellent conductive property. However, if the neighborhood of microwave introducing means is conductive, the ion density in the vicinity of microwave introducing means as previously described is particularly large, so that the electric field with an external electric bias is not effectively applied between the electrode and the substrate as most of the current from the electrode may pass through the microwave introducing means to the reaction vessel side, whereby a larger voltage must be applied to further improve the characteristics of deposit film on the substrate.

If the voltage to be applied to the electrode is increased beyond a predetermined value, the abnormal discharge called a spark will occur. In particular, as the electrode for the application of external bias and the microwave introducing means are located in proximity on the constitution of the apparatus, the spark is more likely to occur from the electrode for the application of external bias to the vicinity of the microwave introducing means if the surface in the neighborhood of the microwave introducing means is made of a conductive material such as metal. The spark is a kind of dielectric breakdown, in which because all the electrical energy passes concentratively to one location, the breakdown of deposit film or substrate itself may be caused. The deposit film having caused the dielectric breakdown due to a locally large energy supplied by the spark may be so fragile in structure so as to be easily peeled off, and peeled pieces may stick onto the deposit film on the substrate and cause defects. Since the spark is more likely to occur with a larger power of microwave, the power of microwave can not be increased excessively.

However, with the constitution of the present invention for the microwave introducing portion, it is possible to make the ion control more efficient and prevent the occurrence of spark. As a result, it is possible to obtain the deposit film having less defects and excellent characteristics.

On the other hand, when the deposit film is formed on the substrate, with the microwave plasma CVD method, the deposit film is also formed on the microwave introducing means at the same time. As the deposit film formed on the microwave introducing means is generally thicker than the deposit film formed on the substrate, the stress of the deposit film due to the temperature during the formation of deposit film is greater than that of the deposit film on the substrate, so that the peeling of deposit film is more likely to occur.

When the microwave introducing means is constituted of a metal only, the plasma is rendered non-uniform, so that the temperature distribution may arise on the deposit film directly heated by the plasma. Furthermore, the temperature of deposit film formed on the wall is largely changed due to the variation of microwave power under the influence of the joule heat produced on the surface of the metallic wall at the same time while the microwave is introduced, thereby causing great stress.

In the present invention, with the constitution as previously described, it is possible to suppress the influence of the joule heat produced on the surface of the metallic wall, relieve the stress acting on the deposit film, and prevent the peeling of deposit film.

Furthermore, as a particularly prominent feature in practicing the present invention, it can be cited that the material of the microwave introducing means can provide great stability and uniformity of the discharge as is not expected with conventional materials. As to the fact that the stability and uniformity of the discharge can be achieved simultaneously with a combination of certain specific materials for the wall of the microwave introducing means, the present inventors have considered that the following mechanism will work though the details are not certain.

That is, when the plasma is produced in the discharge space by providing a dielectric which absorbs a sufficiently small amount of the microwave on the surface of the microwave introducing means composed of a metal which is a reflector of the microwave, the energy distribution of the microwave becomes uniform so as to confine the discharge space from above and below, due to a difference between the phase speed of electromagnetic wave within the dielectric carried between the metal which is a reflector of the microwave and the plasma, and the phase speed of electromagnetic wave within the vacuum. Thereby, the plasma is effectively confined within the discharge space, so that the plasma is efficiently produced while at the same time the microwave can be prevented from concentrating on one point. Furthermore, even if the output or mode from the microwave oscillator may vary with a temporal fluctuation of the microwave power source, the fluctuation of the discharge can be suppressed by absorbing its variation in this portion, so that a stable and uniform discharge can be maintained.

Furthermore, as the density of microwave power is higher in the neighborhood of the microwave introducing portion than in other portions, the higher density of electrons may possibly affect the discharge. With the μW-PCVD method, the pressure in the discharge space is lowered to maintain the characteristics in an excellent state as previously described, but the life of an electron, as well as an atom, molecule, radical, and ion, will be lengthened under such a low pressure.

However, by applying an external bias voltage to substantially improve the characteristics of deposit film, a strong electric field is produced in the vicinity of the microwave introducing means, so that electrons are constrained by the electric field to shorten the life of the electron, making the discharge unstable and easily causing the extinction of discharging. Once the discharge is extinguished, the deposit film on the substrate may be peeled off, or even if it is not peeled, the characteristics of deposit film may be largely decreased due to an abrupt change of the temperature or film quality before and after the extinction of discharge, which makes it difficult to use that film as the product. However, if the surface in the vicinity of the microwave introducing means is made of an insulating material having a small absorbency of the microwave, the deposit film may be less subject to the influence of the electric field even under the application of the external bias voltage, so that the life of the electron is lengthened and the stability of the discharge is further improved.

It is to be understood that the stability and uniformity of the discharge, and further the prevention of the spark can be obtained simultaneously with the synergistic effect.

Figure 1A:
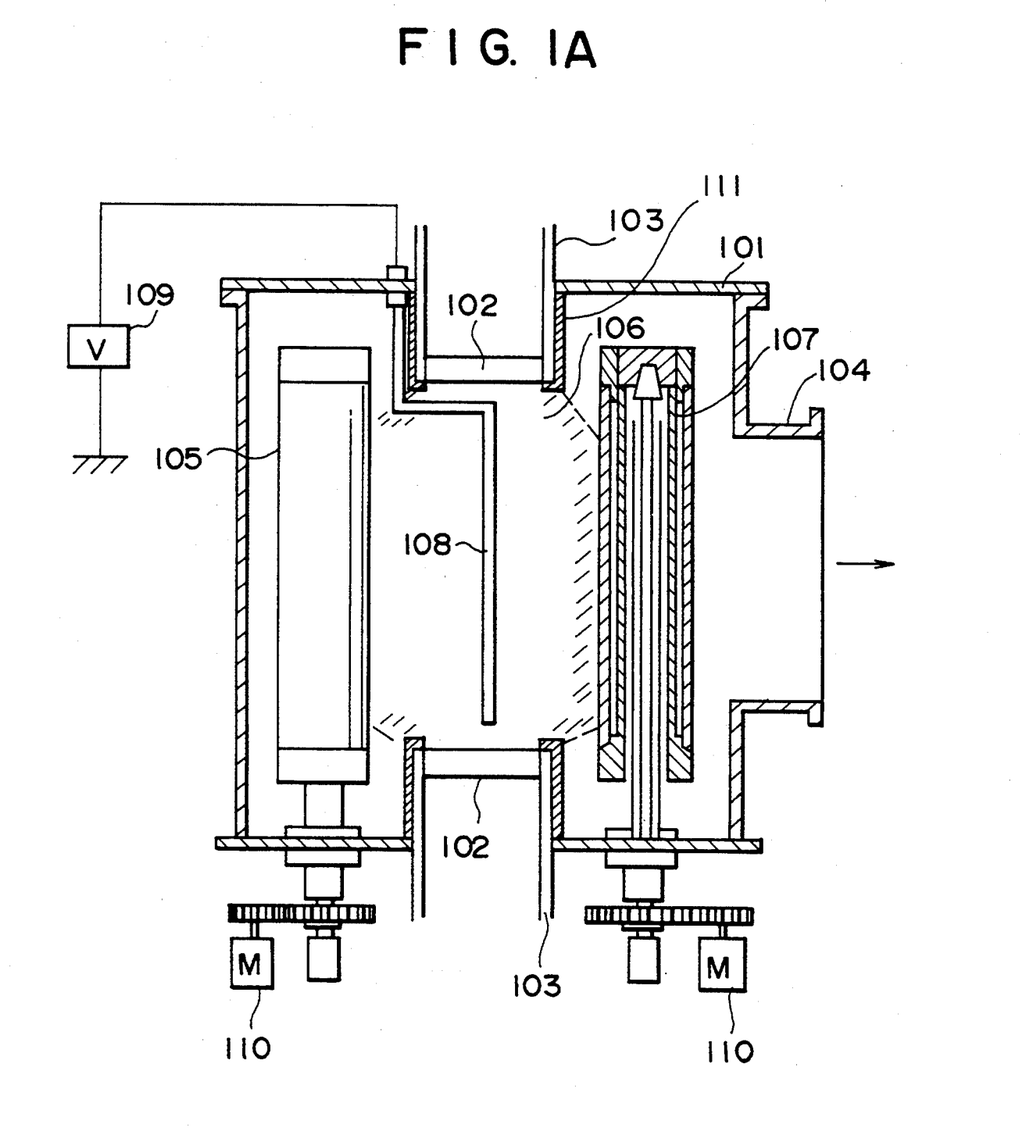
FIGS. 1A and 1B are typical explanatory views of longitudinal cross-section and transversal cross-section showing a typical one example of a deposit film forming apparatus with a microwave plasma CVD method according to the present invention.
Figure 1B:
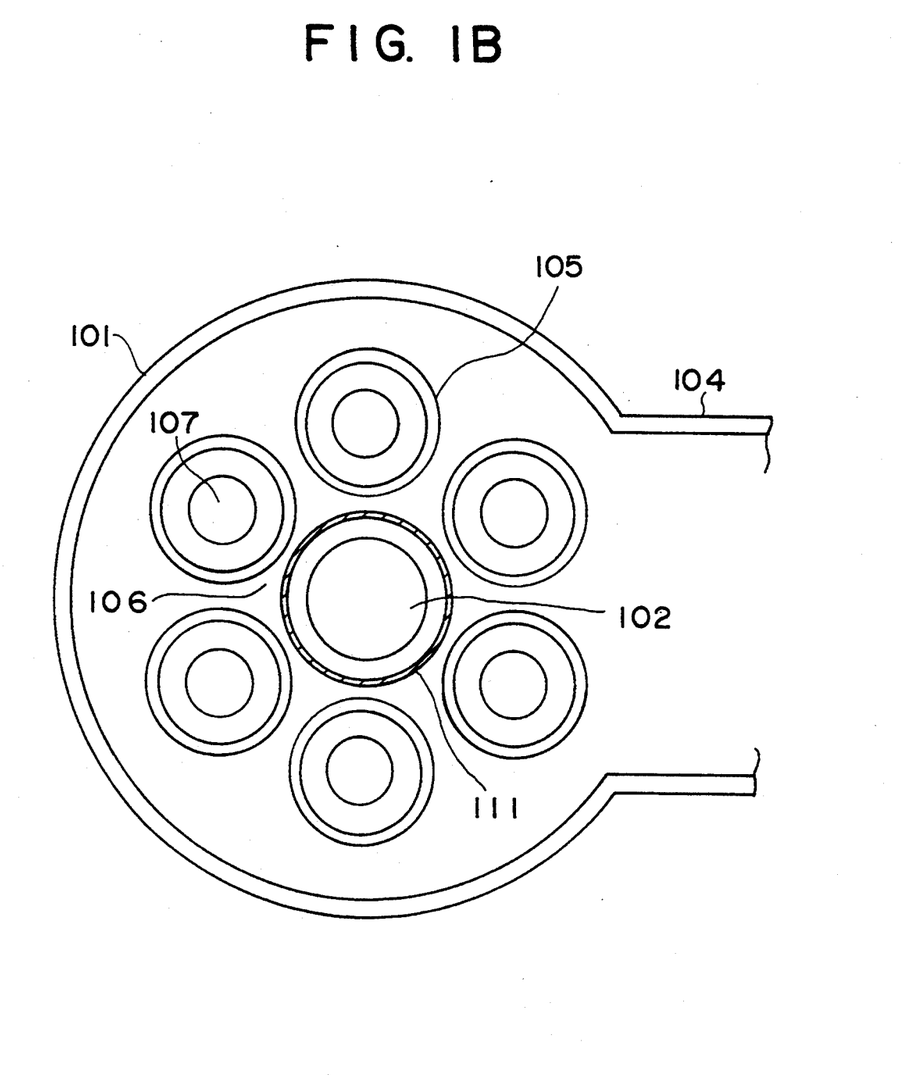
Figure 2:
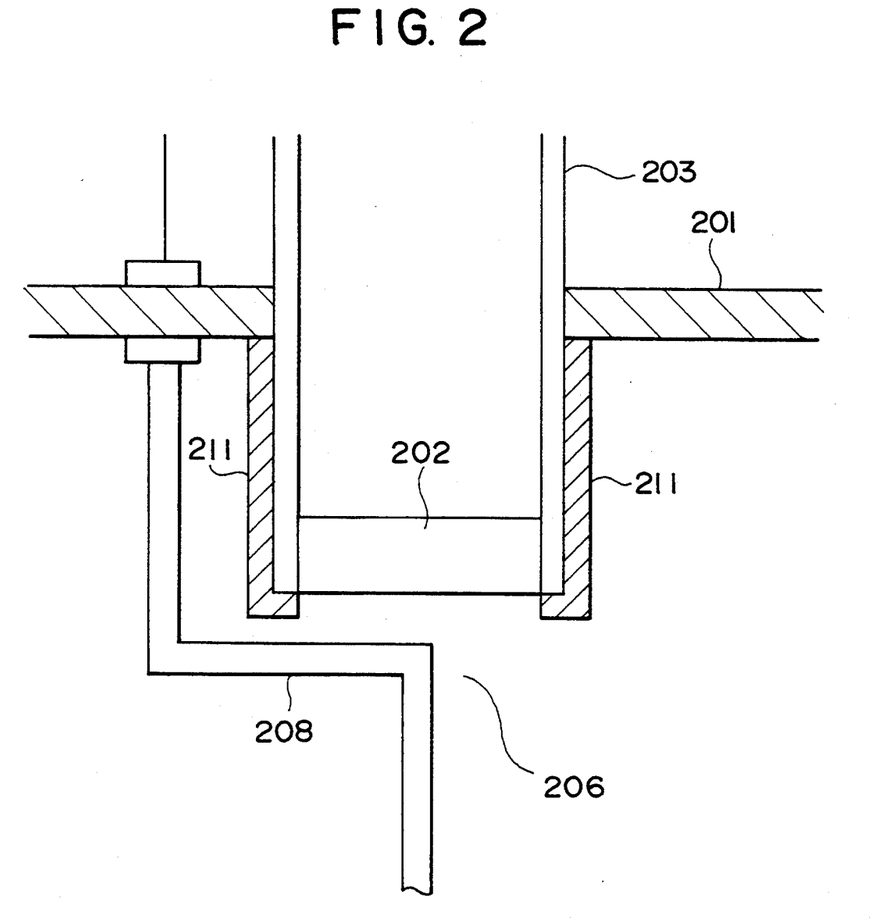
FIG. 2 is a typical view for explaining the neighborhood of microwave introducing means of the deposit film forming apparatus with the microwave plasma CVD method according to the present invention.

In the following, the deposit film forming apparatus of the present invention will be described with reference to FIGS. 1A, 1B and 2. In FIGS. 1A and 1B, 101 to 110 are exactly the same as for the conventional apparatus (shown FIGS. 3A and 3B), but the apparatus of the present invention is different from the conventional apparatus in that the microwave introducing means is constituted of a first area 203 composed of a metal serving to confine the vacuum airtight and the microwave, and a second area 211 composed of a dielectric located on the side of the discharge space 206 of the first area 203, as shown in a detail view of FIG. 2 illustrating the vicinity of the microwave introducing means. The forming procedure of deposit film with the apparatus of the present invention is the same as with the conventional apparatus.

In the present invention, the material of the first area constituting a reaction vessel wall may be any kind if it can retain the vacuum airtight and reflect the microwave, but optimally is aluminum or stainless steel from the viewpoint of the workability and durability.

The material of the second area may be any kind if the product of a dielectric constant ($\epsilon$) and a dielectric loss tangent (tan $\delta$) at a frequency of used microwave is equal to or less than $2\times 10^{-2}$, but for example, alumina ($Al_2O_3$), beryllium oxide (BeO), aluminum nitride (AlN), boron nitride (BN), silicon carbide (SiC), silicon nitride (SIN), silicon dioxide ($SiO_2$), Teflon, (tetrafluoroethylene, Fluorene-containing polymers), or polystyrene can be used. Particularly, ceramics is preferable when the overheating of the substrate is necessary in forming the deposit film, as is the case with the A-Si(H,X), because of its excellent durability and high heat resistance, and particularly ceramics containing alumina ($Al_2O_3$) as the main component was optimal.

The thickness of the dielectric used in the second area may be any size if it is not affected due to the absorption of the microwave, but is preferably 2 cm or less, and more preferably, 1 cm or less.

The method of joining the first and second areas in the present invention may be any method if the thickness of the dielectric in the second area can be made uniform, for example, a method of adhesively attaching the dielectric plate to the metallic surface, a method of threadably securing the dielectric plate with a screw, a vacuum evaporation method, a sputtering method, a CVD method, a coating method, or a plasma spray coating method can be used particularly, when a ceramic material such as alumina ceramics is used, the plasma coating method shows an excellent result.

In the apparatus of the present invention, the method of introducing the microwave up to the reaction vessel is a waveguide method, for example, and the method of introducing the microwave into the reaction vessel is a method of passing the microwave through one or more dielectric windows, for example. As the material of the microwave introducing window into the reaction vessel, a material of small microwave loss such as alumina ($Al_2O_3$), aluminum nitride (AlN), boron nitride (BN), silicon nitride (SIN), silicon carbide (SiC), silicon dioxide ($SiO_2$), beryllium oxide (BeO), Teflon (tetrafluoroethylene, fluorene-containing polymers), or polystyrene can be usually used.

In the formation of deposit film using the apparatus of the present invention, the pressure of the discharge space in forming the deposit film took effect in either area, but particularly, quite excellent results could be reproducibly obtained in a range of preferably less than 100 m Torr, more preferably less than 50 m Torr, and most preferably less than 30 m Torr.

The heating method of the substrate in forming the deposit film using the apparatus of the present invention may be any method if it is based on the heating element in the vacuum specification, but more specifically, an electrical resistive heating element such as sheath-like heater, coiled heater, plate-like heater or ceramics heater, a heat radiation lamp heating element such as tungsten halogen lamp or infrared lamp, or a heating element with heat exchange means using a heat medium such as liquid or gas. The surface material of heating means may be metal such as stainless steel, nickel, aluminum or copper, ceramics, or heat resistant polymeric resin.

Alternatively, another method can be used in which a special heating vessel is provided in addition to the reaction vessel, and after heating, the substrate is conveyed in the vacuum into the reaction vessel.

As the source gas of the deposit film in forming the deposit film using the apparatus of the present invention, an amorphous silicon forming source gas such as silane ($SiH_4$) or disilane ($Si_2H_6$), a functional deposit film forming source gas such as germane ($GeH_4$) or methane ($CH_4$), or a mixed gas from them can be used.

As the dilution gas, hydrogen ($H_2$), argon (Ar) or helium (He) can be used.

As the characteristic improving gas for varying the band gap width of deposit film, an element containing a nitrogen atom such as nitrogen ($N_2$) or ammonia ($NH_3$), an element containing an oxygen atom such as oxygen ($O_2$), nitrogen oxide (NO) or nitrous oxide ($N_2O$), a hydrocarbon such as methane ($CH_4$), ethane ($C_2H_6$), ethylene ($C_2H_4$), acetylene ($C_2H_2$) or propane ($C_3H_8$), silicon tetrafluoride ($SiF_4$), disilicon hexafluoride ($Si_2F_6$) or germanium tetrafluoride ($GeF_4$), or a mixed gas from them can be used.

The present invention is also effective if dopant gases such as diborane ($B_2H_6$), boron trifluoride ($BF_3$) or phosphine ($PH_3$) are introduced together into the discharge space for the purpose of doping.

In the present invention, the electric field produced between the electrode and the substrate is preferably a D.C. electric field, and the direction of the electric field is preferably from the electrode to the substrate. The average magnitude of D.C. voltage applied to the electrode for producing the electric field is preferably from 15 V to 300 V, and more preferably from 30 V to 200 V. The waveform of D.C. voltage is not specifically limited, but any waveform may be effective in the present invention. That is, any waveform can be satisfied unless the direction of voltage is changed over time, and for example, a constant voltage with unchanged level with time, a pulsed voltage or a pulsating voltage having the level changed with time and rectified by a rectifier is also effective in the present invention.

The application of A.C. voltage is also effective in the present invention. The A.C. frequency may be no problem with any frequency, and practically, 50 Hz or 60 Hz for the low frequency, and 13.56 MHz for the high frequency are suitable. As the A.C. waveform, a sine or square waveform, or any other waveforms may be sufficient, but practically, the sine wave is preferable. Note that the voltage refers to the effective value in all cases.

The size and shape of the electrode is arbitrary unless the discharge may be disturbed. Practically, a cylindrical shape from 1 mm to 5 cm in diameter is preferable. Then the length of the electrode can be arbitrarily set if the electric field is uniformly applied onto the substrate.

The material of the substrate may be any material if the surface is conductive, but for example, a metal such as stainless steel, Al, Cr, Mo, Au, In, Nb, Te, V, Ti, Pt, Pd or Fe, an alloy from them, glass, ceramics or plastic whose surface has been processed to be conductive can usually be used in the present invention.

As the substrate material, for example, a metal such as stainless steel, Al, Cr, Mo, Au, In, Nb, Te, V, Ti, Pt, Pd or Fe, an alloy from them, a synthetic resin such as polycarbonate whose surface has been processed to be conductive, glass, ceramics or paper can be usually used in the present invention.

The substrate temperature in forming the deposit film with the apparatus of the present invention may be effective at any temperature, but when deposition amorphous silicon, a range from 20° C. to 500° C., and preferably from 50° C. to 450° C. is preferable to exhibit good effects.

Furthermore, the apparatus of the present invention is applicable to a photosensitive member for a copying machine or printer such as a blocking amorphous silicon photosensitive member or a high resistive amorphous silicon photosensitive member, or any other devices requiring the functional deposit film having excellent electrical characteristics.

The present invention is adaptable to any apparatus using the microwave, and particularly, has a great effect for an apparatus having the constitution in which the substrate is provided to surround the discharge space. The microwave is introduced from at least one end side of the substrate through the waveguide, and the voltage is applied to the electrode provided on the discharge space.

In the following, the effects of the microwave introducing means of the present invention constituted as above will be specifically described in connection with the experimental examples.

Experimental examples

Using the deposit film forming apparatus with the $\mu$W-PCVD method as shown in FIG. 1 with the microwave introducing means as shown in FIG. 2, the first area of the microwave introducing means was made of stainless steel, and the product of a dielectric constant ($\epsilon$) and a dielectric loss tangent (tan $\delta$) at a frequency of used microwave was changed for a dielectric constituting the second area, A-Si(H,X) was formed under the fabricating conditions as shown in Table 1, and the electrical characteristics of deposit film, the uniformity and the number of defects, and the stability of discharge were examined. As the material of the dielectric constituting the second area of the microwave introducing means, ceramics having the main component of $Al_2O_3$, MgO or $SiO_2$, such as alumina, steatite or mullite was used, and the product of dielectric constant ($\epsilon$) and dielectric loss tangent (tan $\delta$) was changed by varying the content of $Al_2O_3$, MgO or $SiO_2$ which were components of each ceramics and the content of impurities, and further varying the burning condition. The result is shown in Table 2.

In the Table, the "electrical characteristic" indicates the ratio of light conductivity to dark conductivity for an obtained deposit film in the relative evaluation, assuming that it is 100% for the deposit film obtained with the constitution in which the microwave introducing means is all composed of a metal only. Then using a 7059 glass plate manufactured by Corning Inc., on which a Cr gap electrode was evaporated in vacuum, as the substrate, a cylindrical aluminum cylinder was formed with a groove, in which the substrate was set and the deposit film was formed.

The light conductivity and the dark conductivity were determined by measuring the conductivity with a microammeter (4140B manufactured by YHP) and using a 7 mW He—Ne laser as the light source for the measurement of the light conductivity.

The "uniformity" as indicated in the table shows a difference between the maximum and minimum values of film thickness in the generatrix direction of the cylindrical substrate for the deposit film. Assuming that it is 100% for the deposit film obtained in the constitution in which the microwave introducing means is all composed of a metal only, four stages of relative evaluation were made by indicating ✕ for more than 100%, △ for 50% to 100%, ◯ for 30% to 50%, and ◉ for 30% or less.

The "defect" indicates an evaluation in four stages in observing the surface of deposit film at 50✕ magnification using an optical microscope, in which it is ranked as A if no defect of 100 micron or greater, or further 50 micron or greater, is visible, B if no defect of 100 micron or greater is visible completely, C if several defects of 100 micron or greater are visible on an entire surface of the substrate by moving a sample, and D if many defects of 100 micron or greater are visible in the full field of view causing the image defect in the electrophotographic photosensitive member.

The "discharge stability" is based on a result of measuring the luminous intensity at the discharge by inserting a glass fiber from a feedthrough, not shown, into the reaction vessel 101 in FIG. 1, and connecting it to a spectrophotometer. And it shows a width between the maximum and minimum values of the luminous intensity divided by its average value, that is, the dispersion of the luminous intensity, with four stages of evaluation in which it is ⊚ for 0.2 or less, ○ for 0.2 to 0.5, Δ for 0.5 to 1, and × for more than 1.

As will be clear from Table 2, as the material of dielectric constituting the second area of the microwave introducing means, good results were offered when the product of dielectric constant ($\epsilon$) and dielectric loss tangent (tan $\delta$) is equal to or less than $2\times10^{-2}$.

As above described, it has been suggested that when the functional deposit film is formed on the substrate by introducing a source gas for the formation of deposit film into the space surrounded by a plurality of substrates disposed within the reaction vessel, causing the discharge within the space by the use of the microwave energy, and applying the voltage to the electrode provided within the discharge space, a constitution is effective to resolve the above-mentioned conventional problems in which the microwave introducing means is constituted of two areas made of different materials, the first area on the atmosphere side is composed of a metal, and the second area in contact with the plasma is composed of a dielectric having less absorbency of the microwave.

EXAMPLES

In the following, specific examples and a comparative example will be described to illustrate the effects of the present invention, but the present invention is not limited to these examples.

EXAMPLE 1

Using the deposit film forming apparatus as shown in FIG. 1 (the details of the vicinity of the microwave introducing means are shown in FIG. 2), the electrophotographic photosensitive member was fabricated under the fabrication conditions as shown in Table 3 and in accordance with a procedure as previously detailed.

In this example, the material of the second area in the microwave introducing means was alumina ceramics having a purity of 98%, with the product of dielectric constant ($\epsilon$) and dielectric loss tangent (tan $\delta$) at a microwave frequency of 2.45 GHz being $1\times10^{-2}$, and the stainless steel surface of the first area was coated with the plasma spray.

Comparative example

The microwave introducing means in the example 1 was replaced with a conventional one made of stainless steel only, and the electrophotographic photosensitive member was fabricated.

The electrophotographic photosensitive member fabricated in example 1 and the comparative example was set on an electrophotographic apparatus which retrofitted a copying machine NP-7550 manufactured by Canon Inc. for the experiment, in which Table 4 shows the results from the evaluation of surface potential characteristics (charging ability, sensitivity) (relative value when the value of comparative example is 100%), the evaluation of the uniformity of half-tone image density in the entire image area (three stages of evaluation in which it is ranked as ○ if any density difference of 0.3 or more in the entire image area is not practically a problem, Δ if no density difference of 0.5 or more is visible, but any density difference of 0.3 or more is visible, and × if the any density difference of 0.5 or more is visible), the evaluation of the occurrence of defects (voids) in all black image (four stages of evaluation in which it is A as the superiority if any voids of 0.3 mm or greater can not be completely seen, B if several voids of 0.3 mm or greater can be seen but there is no problems in practice, C if any voids of 0.3 mm or greater can be partly seen and there is slight problem in practice, and D if many voids of 0.3 mm or greater can be seen in the entire surface of image area).

From Table 4, by using the microwave introducing means of the present invention, it will be found that electrophotographic photosensitive member excellent in image characteristics and electrophotographic characteristics, and superior in the quality could be efficiently obtained.

Example 2

The same evaluation as in example 1 was performed by fabricating the electrophotographic photosensitive member under the fabrication conditions as shown in Table 5, so that an excellent result in connection with image defects and electrophotographic characteristics could be obtained, as in example 1.

Example 3

The same evaluation as in example 1 was performed by fabricating the electrophotographic photosensitive member under the fabrication conditions as shown in Table 6, so that an excellent result in connection with the image defects and electrophotographic characteristics could be obtained, as in the example 1.

Example 4

The same evaluation as in example 1 was performed by fabricating the electrophotographic photosensitive member under the fabrication conditions as shown in Table 7, so that an excellent result in connection with image defects and electrophotographic characteristics could be obtained, as in example 1.

TABLE 1

| Fabrication conditions | |
|---|---|
| Source gas | SiH$_4$ 300 sccm |
| Reaction vessel internal pressure | 1 m Torr |
| μW power | 0.7 W/cm$^3$ |
| Instantaneous applied D.C. voltage | 120 V |

Fabrication conditions

TABLE 2

| | $\epsilon \times \tan \delta$ | | | | | | | | |
|---|---|---|---|---|---|---|---|---|---|
| | $3\times10^{-3}$ | $5\times10^{-3}$ | $1\times10^{-2}$ | $1.5\times10^{-2}$ | $2\times10^{-2}$ | $2.5\times10^{-2}$ | $3\times10^{-2}$ | $3.5\times10^{-2}$ | $5\times10^{-2}$ |
| Electrical characteristics | 220 | 210 | 210 | 200 | 200 | 120 | 110 | 105 | 105 |
| Uniformity | ⊚ | ⊚ | ⊚ | ⊚ | ○ | Δ | Δ | Δ | × |
| Defects | A | A | A | A | A | B | B | C | C |
| Stability of discharge | ⊚ | ⊚ | ⊚ | ⊚ | ⊚ | ○ | Δ | Δ | Δ |

TABLE 3

| Name of layer | Source gas & flow (sccm) | Temperature of substrate (°C.) | Internal pressure (mTorr) | μW power (W/cm³) | Applied DC volt. (V) | Thickness of layer (μm) |
| --- | --- | --- | --- | --- | --- | --- |
| First layer | $SiH_4$ 500<br>$H_2$ 300<br>$SiF_4$ 20<br>$B_2H_6$ 1000 ppm<br>(For $SiH_4$) | 250 | 3 | 0.5 | 100 | 3 |
| Second layer | $SiH_4$ 00<br>$H_2$ 500<br>$SiF_4$ 10<br>$B_2H_6$ 0.3 ppm<br>(For $SiH_4$) | 250 | 3 | 0. | 120 | 20 |
| Third layer | $SiH_4$ 150<br>$CH_2$ 500 | 250 | 2 | 0.5 | 100 | 0.5 |

TABLE 4

|  | Example 1 | Comparative example |
| --- | --- | --- |
| Charging ability | 130 | 100 |
| Sensitivity | 150 | 100 |
| Image uniformity | ○ | Δ |
| Image defects | A | D |

TABLE 5

| Name of layer | Source gas & flow (sccm) | Temperature of substrate (°C.) | Internal pressure (mTorr) | μW power (W/cm³) | Applied DC volt. (V) | Thickness of layer (μm) |
| --- | --- | --- | --- | --- | --- | --- |
| First layer | $SiH_4$ 500<br>$H_2$ 300<br>$SiF_4$ 20<br>$B_2H_6$ 1000 ppm<br>(For $SiH_4$)<br>$GeH_4$ 100<br>NO 10 | 250 | 3 | 0.5 | 80 | 0.5 |
| Second layer | $SiH_4$ 500<br>$H_2$ 300<br>$SiF_4$ 20<br>$B_2H_6$ 1000 ppm<br>(For $SiH_4$) | 250 | 3 | 0.5 | 100 | 3 |
| Third layer | $SiH_4$ 700<br>$H_2$ 500<br>$SiF_4$ 10<br>$B_2H_6$ 0.3 ppm<br>(For $SiH_4$) | 250 | 3 | 0. | 120 | 20 |
| Fourth layer | $SiH_4$ 150<br>$CH_4$ 500 | 250 | 2 | 0.5 | 100 | 0.5 |

TABLE 6

| Name of layer | Source gas & flow (sccm) | Temperature of substrate (°C.) | Internal pressure (mTorr) | μW power (W/cm³) | Applied DC volt. (V) | Thickness of layer (μm) |
| --- | --- | --- | --- | --- | --- | --- |
| First layer | $SiH_4$ 500<br>$C_2H_2$ 50<br>$B_2H_6$ 300 ppm<br>(For $SiH_4$) | 250 | 3 | 0.7 | 100 | 3 |
| Second layer | $SiH_4$ 700<br>$C_2H_2$ 70<br>$B_2H_6$ 5 ppm<br>(For $SiH_4$) | 250 | 3 | 0.7 | 150 | 20 |
| Third layer | $SiH_4$ 300<br>$H_2$ 300<br>$B_2H_6$ 0.3 ppm | 250 | 3 | 0.5 | 100 | 1 |
| Fourth layer | $SiH_4$ 150<br>$CH_4$ 500 | 250 | 2 | 0.3 | 100 | 0.5 |

TABLE 7

| Name of layer | Source gas & flow (sccm) | Temperature of substrate (°C.) | Internal pressure (mTorr) | μW power (W/cm³) | Applied DC volt. (V) | Thickness of layer (μm) |
| --- | --- | --- | --- | --- | --- | --- |
| First layer | $SiH_4$ 500<br>$H_2$ 300<br>$SiF_4$ 20<br>$PH_3$ 200 ppm<br>(For $SiH_4$) | 250 | 3 | 0.5 | 100 | 0.5 |

TABLE 7-continued

| Name of layer | Source gas & flow (sccm) | Temperature of substrate (°C.) | Internal pressure (mTorr) | μW power (W/cm³) | Applied DC volt. (V) | Thickness of layer (μm) |
| --- | --- | --- | --- | --- | --- | --- |
| Second layer | SiH₄ 700<br>H₂ 300<br>SiF₄ 5<br>B₂H₆ 0.1 ppm<br>(For SiH₄) | 250 | 3 | 0.6 | 120 | 20 |
| Third layer | SiH₄ 200<br>CH₄ 500<br>B₂H₆ 1000 ppm<br>(For SiH₄) | 250 | 3 | 0.5 | 100 | 0.5 |
| Fourth layer | SiH₄ 150<br>CH₄ 500 | 250 | 2 | 0.5 | 100 | 0.5 |

What is claimed is:

1. A film forming apparatus comprising cylindrical substrates disposed within a reaction vessel to be substantially sealed so as to surround a discharge space, and microwave introducing means provided to form a microwave discharge plasma containing a reactant arising from a source gas and contributing to the formation of film, applying a voltage to an electrode provided on said discharge space, and forming a deposit film on a surface of said substrate, wherein said microwave introducing means except for at least a microwave introducing dielectric window is constituted of two areas made of mutually different materials, a first area for transporting the microwave is composed of a metal, and a second area in contact with the plasma is composed of a dielectric of which the product of a dielectric constant ($\epsilon$) and a dielectric loss tangent (tan $\delta$) at a frequency of used microwave is equal to or less than $2 \times 10^{-2}$, wherein said microwave introducing dielectric window is sandwiched between said first area.

2. The film forming apparatus according to claim 1, wherein said second area constituting said microwave introducing means selected from the group consisting of ceramics, TEFLON (tetrafluoroethylene, fluorine-containing polymers) and polystyrene.

3. The film forming apparatus according to claim 1, wherein said second area constituting said microwave introducing means is alumina ceramics.

4. The film forming apparatus according to claim 1, wherein the thickness of said dielectric used in said second area constituting said microwave introducing means is equal to or less than 2 cm.

5. A film forming apparatus comprising a reaction vessel to be substantially sealable, microwave introducing means provided to form a microwave discharge plasma containing a reactant arising from a source gas and contributing to the formation of film, an electrode provided in said discharge plasma and an electrically conductive substrate for depositing said reactant,
wherein said microwave introducing means has a microwave introducing dielectric window and a microwave introducing portion wherein said microwave introducing dielectric window and said microwave introducing portion comprises a first area which transmits the microwave and is composed of metal and a second area in contact with the plasma, which is composed of a dielectric of which the product of a dielectric constant ($\epsilon$) and a dielectric loss (tan $\delta$) at a frequency of used microwave is equal to or less than $2 \times 10^{-2}$, wherein said microwave introducing dielectric window is sandwiched between said first area.

6. A film forming apparatus according to claim 5, wherein said microwave introducing means has a projecting shape.

7. A film forming apparatus according to claim 5, wherein a plurality of said microwave introducing means are provided.

8. A film forming apparatus according to claim 7, wherein the plurality of said microwave introducing means are provided opposed to each other.

9. A film forming apparatus according to claim 5, wherein at least said first area of said microwave introducing means is composed of aluminum or stainless steel.

10. A film forming apparatus according to claim 5, wherein at least said second area of said microwave introducing means is composed of alumina, beryllium oxide, boron nitride, silicon carbide, silicon oxide, TEFLON (tetrafluoroethylene, fluoride-containing polymer) or polystyrene.

* * * * *

UNITED STATES PATENT AND TRADEMARK OFFICE
CERTIFICATE OF CORRECTION

PATENT NO. : 5,433,790

DATED : July 18, 1995

INVENTOR(S) : HIROAKI NIINO, ET AL.

It is certified that error appears in the above-indentified patent and that said Letters Patent is hereby corrected as shown below:

On the title page item [57],

Line 18, "$2 \times 10^{-2.}$" should read --$2 \times 10^{-2}$.--.

COLUMN 2

Line 3, "FIG. 3A 9)." should read --FIG. 3A).--.

COLUMN 3

Line 18, "uniform" should be deleted.

COLUMN 4

Line 43, "one" should be deleted.

COLUMN 5

Line 53, "①  1" should read --①--.

COLUMN 6

Line 22, "deposit" should be deleted; and

Line 37, "remarkable" should read --apparent-- and "She" should read --the--.

COLUMN 7

Line 44, "neighborhood" should read --vicinity--; and

Line 63, "neighborhood" should read --vicinity--.

UNITED STATES PATENT AND TRADEMARK OFFICE
CERTIFICATE OF CORRECTION

PATENT NO. : 5,433,790
DATED : July 18, 1995
INVENTOR(S) : HIROAKI NIINO, ET AL.

It is certified that error appears in the above-indentified patent and that said Letters Patent is hereby corrected as shown below:

COLUMN 9

Line 63, "Teflon," should read --TEFLON--;

Line 64, "Fluorene-containing" should read --fluorine-containing--; and

Line 65, "is" should read --are--.

COLUMN 10

Line 10, "uniform, for" should read --uniform. For--;

Line 15, "used particularly," should read --used. Particularly,--; and

Line 28, "Teflon" should read --TEFLON--.

COLUMN 12

Line 23, "was" should read --were--;

Line 27, "each" should read --each of the--; and

Line 54, " $\hat{\odot}$ " should read -- $\odot$ --.

COLUMN 13

Line 6, " $\hat{\odot}$ " should read -- $\odot$ --.

COLUMN 14

Line 17, "problems" should read --problem--;

UNITED STATES PATENT AND TRADEMARK OFFICE
CERTIFICATE OF CORRECTION

PATENT NO. : 5,433,790

DATED : July 18, 1995

INVENTOR(S) : HIROAKI NIINO, ET AL.

It is certified that error appears in the above-indentified patent and that said Letters Patent is hereby corrected as shown below:

COLUMN 14,

Line 57, "Fabrication conditions" should be deleted;

Table 2, under "Uniformity", "⊚̂" (all occurrences) should read -- ⊚ --; and     Table 2, under "Stability of discharge", "⊚̂" (all occurrences) should read -- ⊚ --.

COLUMN 17

Line 33, "sand-" should read --enclosed by--;

Line 34, "wiched between" should be deleted; and

Line 38, "selected" should read --is selected--.

COLUMN 18

Line 30, "sand-" should read --enclosed by--;

Line 31, "wiched between" should be deleted; and

UNITED STATES PATENT AND TRADEMARK OFFICE
CERTIFICATE OF CORRECTION

PATENT NO. : 5,433,790

DATED : July 18, 1995

INVENTOR(S) : HIROAKI NIINO, ET AL.

It is certified that error appears in the above-indentified patent and that said Letters Patent is hereby corrected as shown below:

COLUMN 18,

Line 49, "fluoride-containing" should read --fluorine-containing--.

Signed and Sealed this

Twenty-eighth Day of November 1995

Attest:

BRUCE LEHMAN

*Attesting Officer*     *Commissioner of Patents and Trademarks*